United States Patent
Doyle

(10) Patent No.: US 10,353,615 B2
(45) Date of Patent: Jul. 16, 2019

(54) APPARATUSES AND METHODS FOR SINGLE LEVEL CELL CACHING

(71) Applicant: Micron Technology, Inc., Boise, ID (US)

(72) Inventor: Daniel Doyle, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/102,030

(22) Filed: Aug. 13, 2018

(65) Prior Publication Data

US 2018/0349056 A1    Dec. 6, 2018

Related U.S. Application Data

(63) Continuation of application No. 15/336,071, filed on Oct. 27, 2016, now Pat. No. 10,048,887.

(51) Int. Cl.

| G11C 16/34 | (2006.01) |
|---|---|
| G06F 3/06 | (2006.01) |
| G11C 16/16 | (2006.01) |
| G11C 11/56 | (2006.01) |
| G11C 16/10 | (2006.01) |
| G11C 16/04 | (2006.01) |

(52) U.S. Cl.
CPC ............ *G06F 3/0644* (2013.01); *G06F 3/061* (2013.01); *G06F 3/064* (2013.01); *G06F 3/0619* (2013.01); *G06F 3/0625* (2013.01); *G06F 3/0635* (2013.01); *G06F 3/0659* (2013.01); *G06F 3/0685* (2013.01); *G06F 3/0688* (2013.01); *G11C 11/5628* (2013.01); *G11C 11/5635* (2013.01); *G11C 11/5678* (2013.01); *G11C 16/10* (2013.01); *G11C 16/16* (2013.01); *G11C 11/56* (2013.01); *G11C 16/0483* (2013.01); *G11C 2211/562* (2013.01); *G11C 2211/5641* (2013.01); *Y02D 10/154* (2018.01)

(58) Field of Classification Search
CPC .... G06F 3/0644; G06F 3/0619; G06F 3/0635; G06F 3/064; G06F 3/0659; G06F 3/0688; G11C 11/5628
USPC .................................................. 365/189.011
See application file for complete search history.

(56) References Cited

U.S. PATENT DOCUMENTS

| 5,930,167 A * | 7/1999 | Lee ..................... G06F 12/0246 365/185.03 |
|---|---|---|
| 6,522,580 B2 | 2/2003 | Chen et al. |
| 8,760,957 B2 | 6/2014 | Lee et al. |
| 8,891,301 B1 | 11/2014 | Shlick et al. |
| 10,048,887 B2 | 8/2018 | Doyle |

(Continued)

OTHER PUBLICATIONS

U.S. Appl. No. 16/101,951 titled "Apparatuses and Methods for Single Level Cell Caching" filed Aug. 13, 2018.

*Primary Examiner* — Xiaochun L Chen

(74) *Attorney, Agent, or Firm* — Dorsey & Whitney LLP

(57) ABSTRACT

Methods and apparatuses for single level cell caching are described. According to one example, a method includes receiving, at a memory device, a first set of data to be stored in a lower page of multilevel memory cells, storing the first set of data in a page of single level memory cells, storing the first set of data in the lower page of the multilevel memory cells, receiving, at the memory device, a second set of data to be stored in an upper page of the multilevel memory cells, and storing the second set of data directly in the upper page of the multilevel memory cells.

12 Claims, 4 Drawing Sheets

(56) References Cited

U.S. PATENT DOCUMENTS

| | | |
|---|---|---|
| 2006/0259718 A1 | 11/2006 | Paley |
| 2011/0010484 A1 | 1/2011 | Sprouse et al. |
| 2013/0258772 A1 | 10/2013 | Lee et al. |
| 2014/0133220 A1* | 5/2014 | Danilak .............. G06F 12/0246 365/158 |
| 2015/0109859 A1 | 4/2015 | Hsu et al. |
| 2015/0155050 A1* | 6/2015 | Trantham ........... G11C 16/3418 365/185.03 |
| 2018/0121128 A1 | 5/2018 | Doyle |
| 2018/0349055 A1 | 12/2018 | Doyle |

* cited by examiner

APPARATUSES AND METHODS FOR SINGLE LEVEL CELL CACHING

CROSS-REFERENCE TO RELATED APPLICATION(S)

This application is a continuation of U.S. patent application Ser. No. 15/336,071, filed Oct. 27, 2016 and issued as U.S. Pat. No. 10,048,887 on Aug. 14, 2018. This application, and issued patent, is incorporated by reference herein, in its entirety, and for any purposes

BACKGROUND

Memory devices often include arrays of multilevel memory cells (MLC), in which each memory cells stores two or more bits of data. For example, in multilevel cells configured to store two bits, the bits commonly referred to as a lower bit and an upper bit. The lower bits and upper bits are organized into lower pages and upper pages, respectively. Collections of pages are arranged into blocks. When write data are provided to the memory device for storage, the lower pages of the memory cells in a block may be written to first. At a later time, the upper pages of the memory cells in the block are written to. This process is commonly referred to as a multipass algorithm because the write operation occurs in two passes: the first pass to program the lower page, and the second pass to program the upper page. Generally, after each pass, the memory device transmits a confirmation message to the host that the data are securely stored in the memory device and no longer needs to be preserved by the host. However, if power to the memory device is lost during the second pass to write data to upper page, then there is a possibility that the data stored in the lower page can be lost and cannot be recovered.

DETAILED DESCRIPTION

Figure 1:
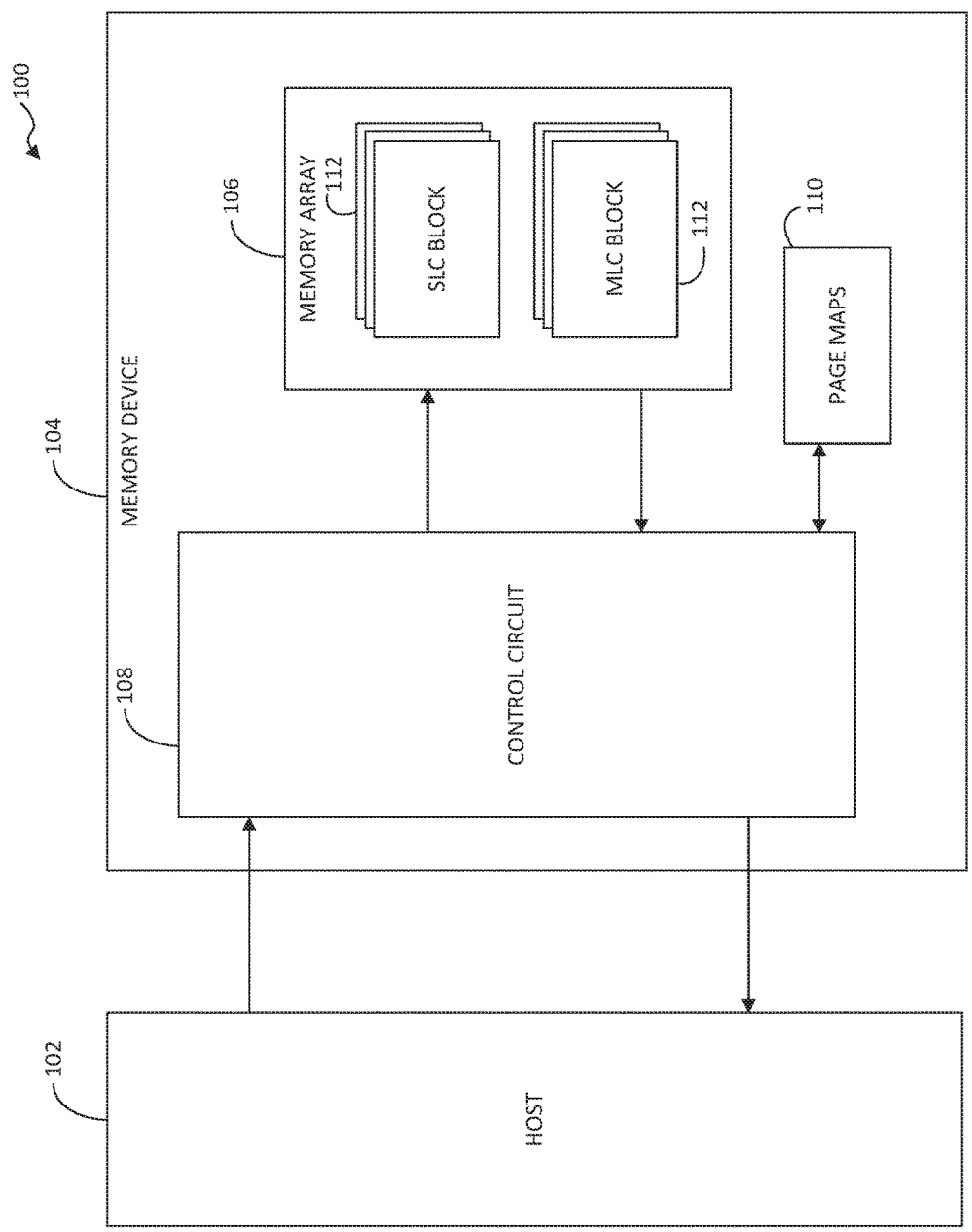
FIG. 1 is a block diagram of a memory system, in accordance with an embodiment of the present invention.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

To avoid the loss of data, some memory devices use single level cell (SLC) caching. In traditional SLC caching, all incoming write data are initially stored in SLC blocks prior to being written to an MLC block. For example, a control circuit receives write data to be stored in a lower page of an MLC block and initially stores the write data in a first SLC block. The control circuit then receives write data to be stored in an upper page of the MLC block and initially stores the write data in a second SLC block. The control circuit then copies the write data from the first SLC block to the lower page of the MLC block and the write data from the second SLC block to the upper page of the MLC block. The potential loss of data resulting from power loss during the write operation to the MLC block is avoided because all of the data are stored in the SLC blocks and can be retrieved after power is restored. Alternatively, some storage systems employ hold up capacitors, which maintain the voltage stored on cells of lower pages of the MLC block in the event of power loss, thus preserving the data stored therein.

Traditional SLC caching suffers from several drawbacks. For example, traditional SLC caching increases the write amplification (the number of write operations that must be performed before the data are stored in its final location). For an MLC that stores two pages of data, the write amplification for traditional SLC caching is three (one for writing the first SLC block, one for writing the second SLC block, and one for writing the MLC block). Higher write amplification can lead to faster wear as blocks are written to more frequently. Additionally, traditional SLC caching requires additional error correction operations. Because all data are initially written to SLC blocks before being transferred to the MLC block, error correction is generally performed on the data stored in the SLC blocks before writing them to the MLC blocks. Otherwise, any errors that occurred when writing the SLC blocks would be transferred to the MLC blocks. Performing error correction between the SLC and MLC blocks ensures that the correct data are stored in the MLC, but it increases the time and power consumption of writing to the MLC blocks.

Further, SLC caching becomes less effective as the memory device ages. As the memory device ages, blocks of cells wear out and are retired by the memory device, meaning that the blocks are no longer used to store information. Traditional SLC caching typically requires a large number of SLC blocks to effectively cache all of the incoming data. As the device ages and SLC blocks are retired, fewer SLC blocks are available to cache the incoming data, which leads to increased latency in performing write operations, and accelerates failure of the remaining blocks as there are fewer SLC blocks among which the workload can be spread.

The use of hold up capacitors also suffers from certain drawbacks. For example, hold up capacitors add significant complexity to the design of the storage system and take up valuable space in the system. Additionally, hold up capacitors add significant cost to the storage system, increasing the cost of manufacturing the system. The added cost must be absorbed by the manufacturer or passed on to the consumer.

Accordingly, there is a need for a way to recover data lost during a power failure that can be used near the memory device's end of life. This disclosure is directed to methods of SLC caching that can reduce the write amplification and the number of SLC blocks needed to mitigate the risk of data loss on lower pages because of power loss while writing to an upper page without adding expensive and complex hold up capacitors. In some example embodiments, the disclosed methods may be used as the memory device approaches its end of life preserving the life span of remaining blocks is of increased importance.

FIG. 1 is a block diagram of a memory system, generally designated 100, in accordance with an embodiment of the present invention. The memory system 100 generally includes a host 102 and a memory device 104. The host 102 may be any system or device capable of communicating with the memory device 104. The host 102 may be a processor based system. For example, the host 102 may be a desktop computer, a laptop computer, a tablet computer, a smartphone, a personal digital assistant, or any other programmable electronic device capable of communicating with the memory device 104. In various embodiments, the host 102 is configured to provide write data to be stored in the memory device 104. For example, the host 102 may be configured to provide a write command and associated write data to the memory device 104. Responsive to receiving the write command, the memory device 104 may store the write data in the memory device 104.

The memory device 104 includes a memory array 106, a control circuit 108, and page maps 110. The memory array 106 includes a plurality of memory cells that are configured to store data. The memory cells may be accessed in the array through the use of various signal lines, word lines (WLs) and/or bit lines (BLs) (not shown in FIG. 1). The memory cells may be non-volatile memory cells, such as NAND or NOR flash cells, phase change memory cells, or any other type of non-volatile memory cells.

The memory cells of the memory array 106 may be arranged into addressable blocks, such as single level cell memory blocks and multi-level cell memory blocks. In the embodiment of FIG. 1, the memory array 106 includes one or more SLC blocks 112 and one or more MLC blocks 114. The addressable blocks may include arrays of single level memory cells, multi-level memory cells, triple level memory cells, etc. Each addressable block may include one or more pages in which data may be stored. For example, the SLC block 112 may include one or more pages consisting of an array of single level memory cells. The bits of the MLC blocks 114 may be divided into lower pages and upper pages. For example, a lower page may include a first bit each of the multilevel memory cells and an upper page may include the second bit from each of the multilevel memory cells. Data may be written to the MLC block 114 on a page-by-page basis. For example, data may be written to the lower page in a single write operation to the MLC block 114. A subsequent write operation may write data to the upper page of the MLC block 114. In some embodiments, certain pages of the MLC block 114 may be designated as single-level pages, in which only one of the pages (e.g., the lower page) is written to. Although embodiments are described throughout with reference to single level cells and to multilevel cells have two bits (i.e., an upper page and a lower page), those skilled in the art will appreciate that memory cells having any number of bits stored thereon may be used. For example, triple level memory cells (having three bits per cell), quad level memory cells (having four bits per cell), and memory cells having more than four bits may all be used. In general, embodiments of the present invention are applicable to any memory device structure that employs a multipass programming algorithm.

Page maps 110 provide information regarding the current state of the memory array 106. For example, the page maps 110 may indicate whether each page in the SLC blocks 112 and/or the MLC blocks 114 have data stored in them at any given point in time. There may be one page map 110 for each block in the memory array 106. The page map for a particular block may include a list of entries including one entry for each page in the block. The list entries may indicate whether data are stored in the page. Based on whether the pages have data stored in them, the control circuit 108 may determine whether a page can be written to. The page maps may be updated after each write operation or erase operation so that the page maps always accurately reflect the state of the memory array 106. Page maps are discussed in further detail below with respect to FIGS. 2-3C.

The control circuit 108 receives memory commands from the host 102 and performs memory operations responsive to the memory commands. For example, the control circuit 108 may receive a write instruction and associated write data from the host 102. The control circuit 108 may then perform a write operation to one or more pages of memory cells in the memory array 106. The control circuit may determine where to write the write data based on the page maps 110. For example, the control circuit 110 may inspect the page maps 110 to identify an empty page in the SLC blocks 112 and/or the MLC blocks 114 and write the write data to the identified empty page. In various embodiments, the empty page to be written may be identified based on a variety of factors. For example, the control circuit 108 may include a wear leveling scheme to ensure that certain pages are not written to much more often than other pages, thus prolonging the lives of the pages. Additionally, the control circuit 108 may implement a write scheme in which a certain number of lower pages of an MLC block 114 are written to before upper pages are written to. For example, the control circuit 108 may write data to 32 lower pages of an MLC block 114 in a row before writing to the upper pages of that MLC block 114. Embodiments disclosed herein are not limited to any particular write scheme or wear leveling scheme, and may generally be implemented with any such schemes.

The control circuit 108 also maintains the page maps 110. The page maps 110 may be stored within the memory array 106 or in a separate location within the memory device 104. When data are stored in a page of the SLC blocks 112 or the MLC blocks 114, the control circuit 108 may update the page map 110 for the affected block accordingly. In operation, the control circuit 108 receives a write command and write data from the host 102. The control circuit accesses the page maps 110 and identifies a page to write to based on the page maps 110 and any applicable write scheme and/or wear leveling scheme. The control circuit 110 then issues internal control signals to the memory array 106 to write the write data in the identified page(s) in the memory array 106. In writing the write data to the memory array 106, the memory device 104 may use SLC caching as described herein. SLC caching in accordance with this disclosure ensures that the write data are securely stored so that it may be recovered in the event of power loss during writing to an upper page of an MLC block 114. SLC caching in accordance with an embodiment of the present invention is discussed in further detail below with respect to FIGS. 2-3A. Once the write data are stored in the memory array 106, the control circuit 108 may update the page maps 110 to reflect the new state of the memory array 110. Once the data are securely stored by SLC caching in accordance with this disclosure, the control circuit 108 may provide a confirmation message to the host 102.

Figure 2:
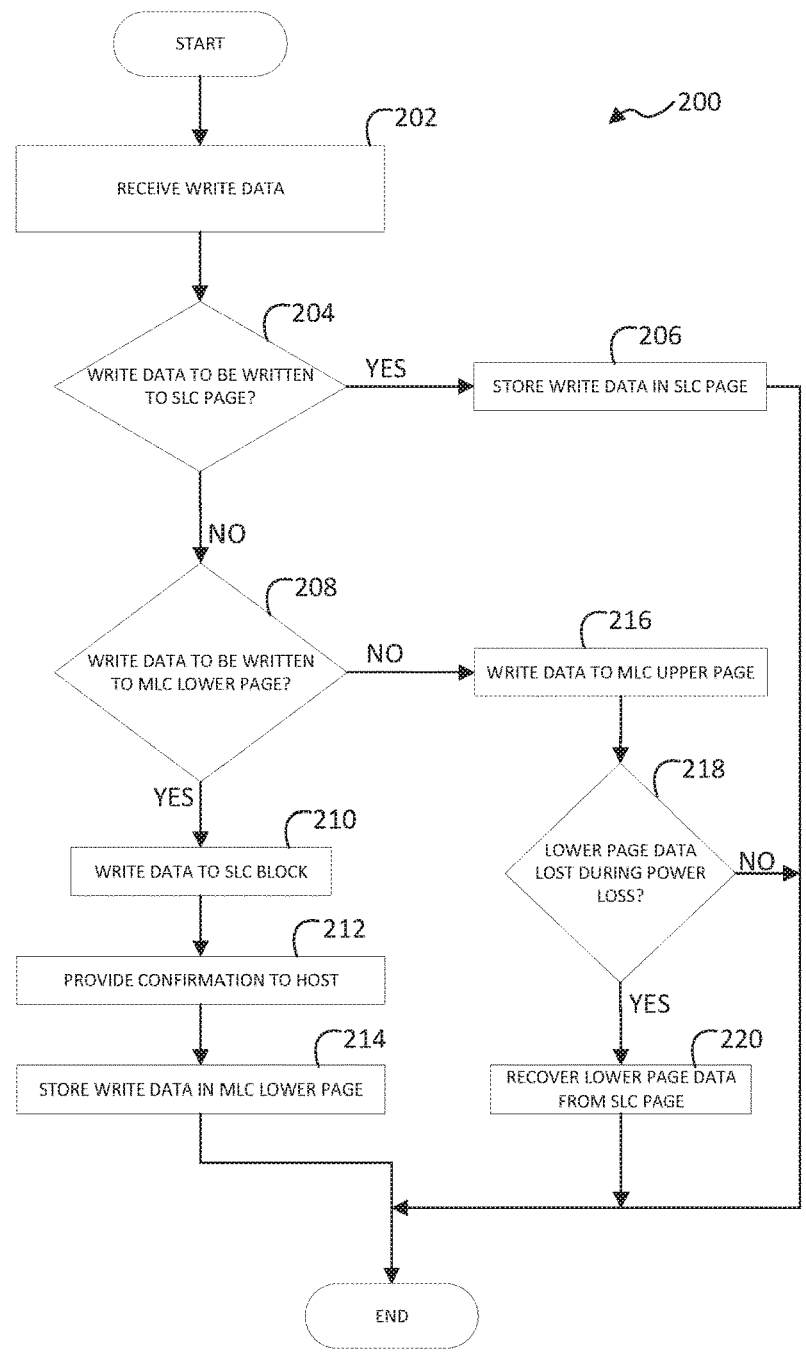
FIG. 2 is a flowchart depicting a method of single level cell caching, in accordance with an embodiment of the present invention.

FIG. 2 is a flowchart of a method of SLC caching, generally designated 200, in accordance with an embodiment of the present invention. For convenience, the operations of the method 200 are described herein as being performed by the control circuit 108 of FIG. 1. However, it should be appreciated that in other embodiments some, or all, of the operations may be performed by other components of a memory device.

In operation 202, the control circuit 108 receives write data. The write data may accompany a write command instructing the memory device 104 to store the write data in the memory array 106. The write data may be received by the control circuit via a data input/output (I/O) bus coupling the control circuit 108 to the host 102. The write data may include one or more pages of data to be stored in one or more pages of the SLC blocks 112 and/or the MLC blocks 114.

In decision block 204, the control circuit 108 determines whether the write data are to be written to an SLC page. The control circuit 108 may also determine the address of a particular SLC page to be written. As discussed above, some pages in the MLC blocks 114 may be designated as SLC pages, meaning that the particular cells in the designated page only store a single page of data. For example, only the lower page may be written with data, while the upper page remains unwritten. Additionally, the memory array may include SLC blocks 112 that are not used in SLC caching, and may have write data stored therein as the final location of the data. The control circuit 108 may determine whether the write data are to be written to an SLC page based on, for example, the page maps 110, the wear leveling scheme employed by the memory device 104, the write scheme, the size of the received write data, and any other relevant factors. In general, any combination of relevant factors may be used to determine whether the write data are to be stored in an SLC page. The scope of the present disclosure is not limited to any particular method of determining whether the write data are to be written to an SLC page. In one example, a number of initial pages in an MLC block 114 may be designated as SLC pages. For example, the first 32 pages in the MLC block 114 may be designated as SLC pages. In such embodiments, the control circuit 108 may determine that the first 32 pages of write data to be written to the MLC block 114 are to be written to SLC pages.

Figure 3A:
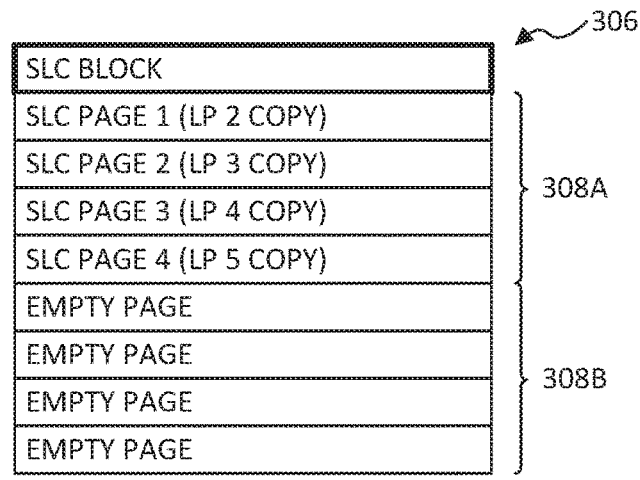
FIG. 3A is an example page map for a single level cell block, in accordance with an embodiment of the present invention.
Figure 3B:
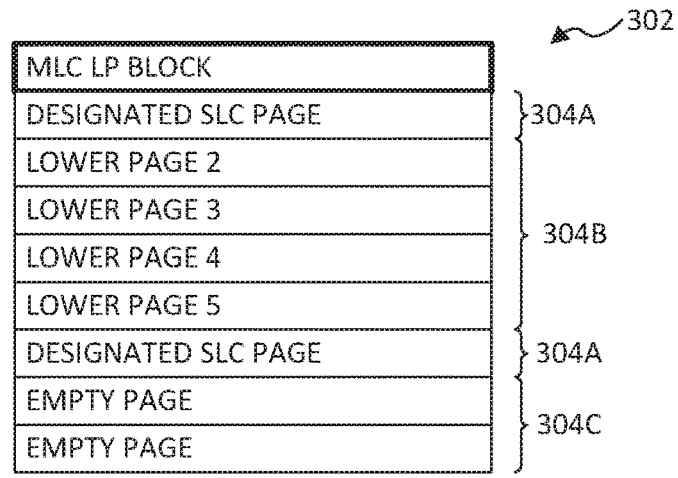
FIG. 3B is an example page map for lower pages of a block of multilevel cells, in accordance with an embodiment of the present invention.

If the control circuit 108 determines that the write data are to be written to an SLC page (decision block 204, YES branch), then the control circuit 108 transmits the write data to the memory array 106 and generates internal commands for the memory array 106 to store the write data in the designated SLC page in operation 206. FIG. 3B is an example page map 302 for lower pages of a block of multilevel cells, such as an MLC block 114, in accordance with an embodiment of the present invention. As shown in FIG. 3B, the page map 302 includes a list of entries 304A-C, where each entry 304 corresponds to a lower page in the MLC block. Each of the entries 304 may designate a particular state of the page. For example, entries 304A indicate that the page is designated as an SLC page. Entries 304B indicate that the pages consist of lower pages of data in an MLC page, which may have one or more corresponding upper pages (see FIG. 3C, below). Entries 304C indicate empty pages in the MLC block 114. The empty pages 304C may include pages designated as SLC pages, pages designated as lower pages of MLC pages, or a combination thereof. When the control circuit 108 determines that the write data are to be written in an SLC page, the control circuit 108 may identify one of the empty pages 304C designated as an SLC page in the page map 302 and transmit the address for the particular empty page 304C to the memory array 106, which then stores the write data in the designated SLC page of the MLC block 114. Alternatively, the control circuit 108 may identify an SLC page in one of the SLC blocks 112 in which to store the write data and transmit the address for the identified SLC page to the memory array 106, which then stores the write data in the identified SLC page of the SLC block 112.

Because the write data are stored in an SLC page in operation 206, there is no need for additional SLC caching. That is, once the data are written to the SLC page, the data are secure and a confirmation message may be provided to the host 102 because there is no risk that the data will be lost as a result of power loss during a write to the upper page. Because the page is designated as an SLC page, even if it is part of an MLC block 114, the upper page is not written to because the memory cells are designated an SLC page.

If the control circuit 108 determines that the write data are not to be written to an SLC page (decision block 204, NO branch), then the control circuit 108 determines whether the write data are to be written to a lower page of the MLC blocks 114 in decision block 208. The control circuit 108 may also identify the address of a particular page of the MLC blocks 114 to be written. If the data are to be stored in a lower page of the MLC block 114, then the control circuit 108 identifies a particular lower page. Alternatively, if the data are not to be stored in a lower page of the MLC block 114 (that is, they are to be stored in an upper page), then the control circuit 108 identifies an upper page of the MLC block 114. The determination in decision block 208 may be made in substantially the same manner as the determination made in decision block 204. That is, the control circuit 108 may determine where the write data are to be stored based on a number of relevant factors, such as the page maps 110, a wear leveling scheme employed by the memory device 104, a write scheme, the size of the received write data, and any other relevant factors. In general, any combination of relevant factors may be used to determine whether the write data are to be stored in a lower page of an MLC block 114. The scope of the present disclosure is not limited to any particular method of determining whether the write data are to be written to a lower page of an MLC block 114.

If the control circuit 108 determines that the write data are to be written to a lower page of the MLC block 114 (decision block 208, YES branch), then the control circuit 108 transmits the write data to the memory array 106 and generates internal commands for the memory array 106 to store the write data in a page of the SLC blocks 112 in operation 210. The write data are stored in the SLC block 112 initially in order to create a secure copy of the write data before storing the write data in its final location within the MLC block 114. Because the write data will be stored in a lower page of the MLC block 114, there is a risk that the data may be lost in the event of power loss while writing to a corresponding upper page of the MLC block 114. In the event of data loss, the write data may be recovered from the SLC block 112 and stored in the lower page of the MLC block 114 again once power is restored.

In operation 212, the control circuit 108 provides a confirmation message to the host 102 that the data are securely stored in the SLC block 112. Once the write data are stored in the SLC block 112, the control circuit 108 may provide a confirmation message to the host 102 indicating that the write data are securely stored within the memory device 104 and that the host 102 no longer needs to maintain a local copy of the write data. Once the host 102 receives the confirmation message, the host 102 may erase any copy of the write data maintained by the host 102 (such as a copy stored in a local cache memory), thus freeing up additional storage for other uses by the host 102. Once the write data are stored in the SLC block 112, a page map 110 corresponding to the SLC block 112 may be updated by the control circuit 108. FIG. 3A is an example page map, generally designated 306, for an SLC block 112, in accordance with an embodiment of the present invention. The page map 306 includes a list of entries 308 where each entry corresponds to a page of an SLC block 112, and includes information on the state of the corresponding SLC page. The entries 308A may indicate that data are stored in the corresponding pages in an SLC block 112. The entries 308B may indicate that the corresponding SLC page is an empty page and does not have any data stored therein.

In operation 214, the control circuit 108 transmits the write data to the memory array 106 and generates internal commands for the memory array 106 to store the write data in the identified lower page of the MLC block 114. Once the write data are stored in a lower page of the MLC block 114, two copies of the write data exist in the memory array 106. A first copy is maintained in the SLC block 112. A second copy is maintained in a lower page of the MLC block 114. As shown in FIGS. 3A and 3B, data are stored in lower pages 2-5 of an MLC block 114 (entries 304B) and copies of the data are stored in SLC pages 1-4 of an SLC block 112 (entries 308A), respectively. Once the write data are stored in the lower page of the MLC block 114, the control circuit 108 may update a page map 110 corresponding to the lower page of the MLC block 114, such as the page map 302.

Returning again to decision block 208, if the control circuit 108 determines that the write data are not to be written to a lower page of an MLC block (decision block 208, NO branch), then the control circuit 108 transmits the write data to the memory array 112 and generates internal commands for the memory array 106 to store the write data directly in an upper page of the MLC block 114 in operation 216. The write data may be stored "directly" in the upper page, meaning that the data is not first written to the SLC block, as in operation 210. By storing the write data directly to the upper page, the number of write operations (e.g., the write amplification) may be reduced when compared to traditional methods of SLC caching. The control circuit 108 may also identify a particular upper page of the MLC block 114. The control circuit 108 may determine which upper page of the MLC block 114 the write data are to be stored in based on a number of relevant factors, such as the page maps 110, a wear leveling scheme employed by the memory device 104, a write scheme, the size of the received write data, and any other relevant factors. In general, any combination of relevant factors may be used to determine whether the write data are to be stored in a lower page of an MLC block 114. The scope of the present disclosure is not limited to any particular method of determining whether the write data are to be written to a lower page of an MLC block 114. In the method 200, write data that are to be stored in an upper page of the MLC block 114 are not stored in an SLC block 112 prior to writing the write data in the upper page of the MLC block 114, as is common in traditional methods of SLC caching. Rather, the write data are stored directly in the upper page of the MLC block 114. Thus, the write amplification of the method 200 is reduced compared to traditional SLC caching because the write data for upper pages do not have to be written to an SLC block 112 prior to writing the write data to the upper page of the MLC block 114. Once the data are written to the upper page of the MLC block 114, the control circuit 108 may update a page map 110 associated with the MLC block 114 into which the data were written.

Figure 3C:
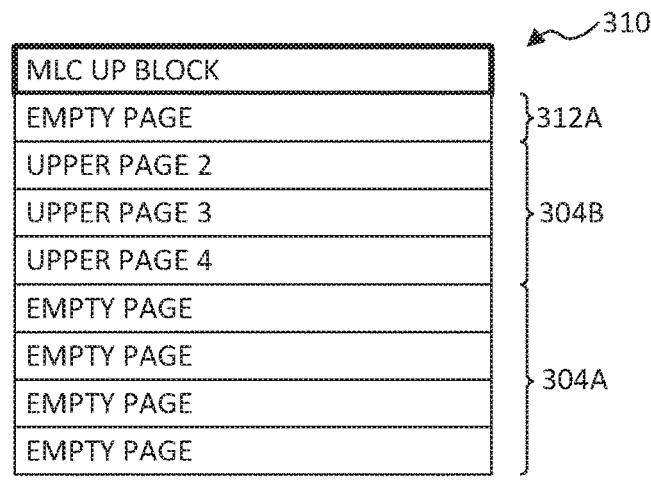
FIG. 3C is an example page map for upper pages of a block of multilevel cells, in accordance with an embodiment of the present invention.

FIG. 3C is an example page map, generally designated 310, for upper pages of a block of multilevel cells, such as MLC block 114, in accordance with an embodiment of the present invention. As shown in FIG. 3C, the page map 310 includes a list of entries 312, where each entry 312 corresponds to an upper page in the MLC block 114. As shown in FIG. 3C, each of the entries 312 may designate a particular state of the page. For example, entries 312A indicate that the page is an empty page, meaning that it does not presently have any data stored therein. Alternatively, the entries 312B indicate that the page has data stored therein. When the control circuit 108 determines that the write data are to be written to an upper page of the MLC block 114, the control circuit 108 may identify one of the empty pages 312A in which to store the write data. The control circuit 108 then updates the page map 310.

In decision block 218, the control circuit 108 determines whether lower page data was lost as the result of power loss during operation 208. In various embodiments, the control circuit 108 may detect a power loss during a write operation to an upper page of an MLC block 114. Responsive to detecting the power loss, the control circuit 108 may sense the lower page of data stored in the same cells as the upper page of the MLC block 114 to determine whether the data stored in the lower page has been damaged, corrupted, erased, or otherwise lost or unusable. If the control circuit 108 determines that the lower page of data has been lost (decision block 218, YES branch), then the control circuit 108 initiates recovery of the lost information from a corresponding page in the SLC block 112, in operation 220. The control circuit 108 may generate internal command signals for the memory array 106 to copy the data stored in a page of the SLC block 112 to the lower page of the MLC block 114 that lost the data in decision block 218.

As an example, with reference to FIGS. 3A-3C, the control circuit 108 may initiate a write operation, as in operation 216, to store write data in an empty page of the MLC block 114 (e.g., an entry 312A in FIG. 3C). If power loss occurs while writing to the upper page, data stored in the corresponding lower page of the MLC block 114 (e.g., an entry 304B) may have its data lost or corrupted. The control circuit 108 may detect the power loss and the lost data. The control circuit may then provide commands to the memory array 106 to copy the data stored in a corresponding SLC page of the SLC block 112 to the lower page that lost its data in the MLC block 114. For example, if lower page 5 loses data during power loss, the control circuit 108 may instruct the memory array to copy the contents of SLC page 4, which has stored therein a copy of the data from lower page 5, to the lower page 5 of the MLC block 114. Thus, the data are not lost as a result of power loss because it can be recovered from the SLC block 112.

The SLC block 112 may be periodically erased so long as all of the data stored in the SLC block 112 has been copied to the MLC block 114. For example, the control circuit 108 may periodically sense the SLC block 112 to determine whether the SLC block 112 is full (i.e., has data stored in each SLC page). When the SLC block 112 is full, the control circuit may ensure that all of the data stored in the SLC block 112 is copied to the MLC block 114 and then provide instructions to the memory array 106 to erase the SLC block 112. Thus, the SLC block 112 may be reused for future SLC caching. By allowing the SLC blocks 112 to be periodically erased, embodiments of the present invention may enable the method 200 to be performed with a small number of SLC blocks. Limiting the number of necessary SLC blocks 112 to perform SLC caching is particularly useful as the memory device 104 approaches the end of its life and the number of available blocks decreases as faulty blocks are retired and functioning blocks without data stored therein become fewer. Therefore, while methods of SLC caching according to this disclosure may be implemented at any point during the life span of the memory device 104, the methods disclosed herein may be of particular utility near the end of the life of the memory device 104. Accordingly, in some embodiments, the memory device 104 may employ a traditional method of SLC caching early in the life of the memory device 104 in order to take advantage of certain benefits, such as faster write times, but at the end of life, employ method of SLC caching in accordance with this disclosure to extend the life of the memory device 104 and limit the number of blocks of memory cells needed for SLC caching.

Figure 4:
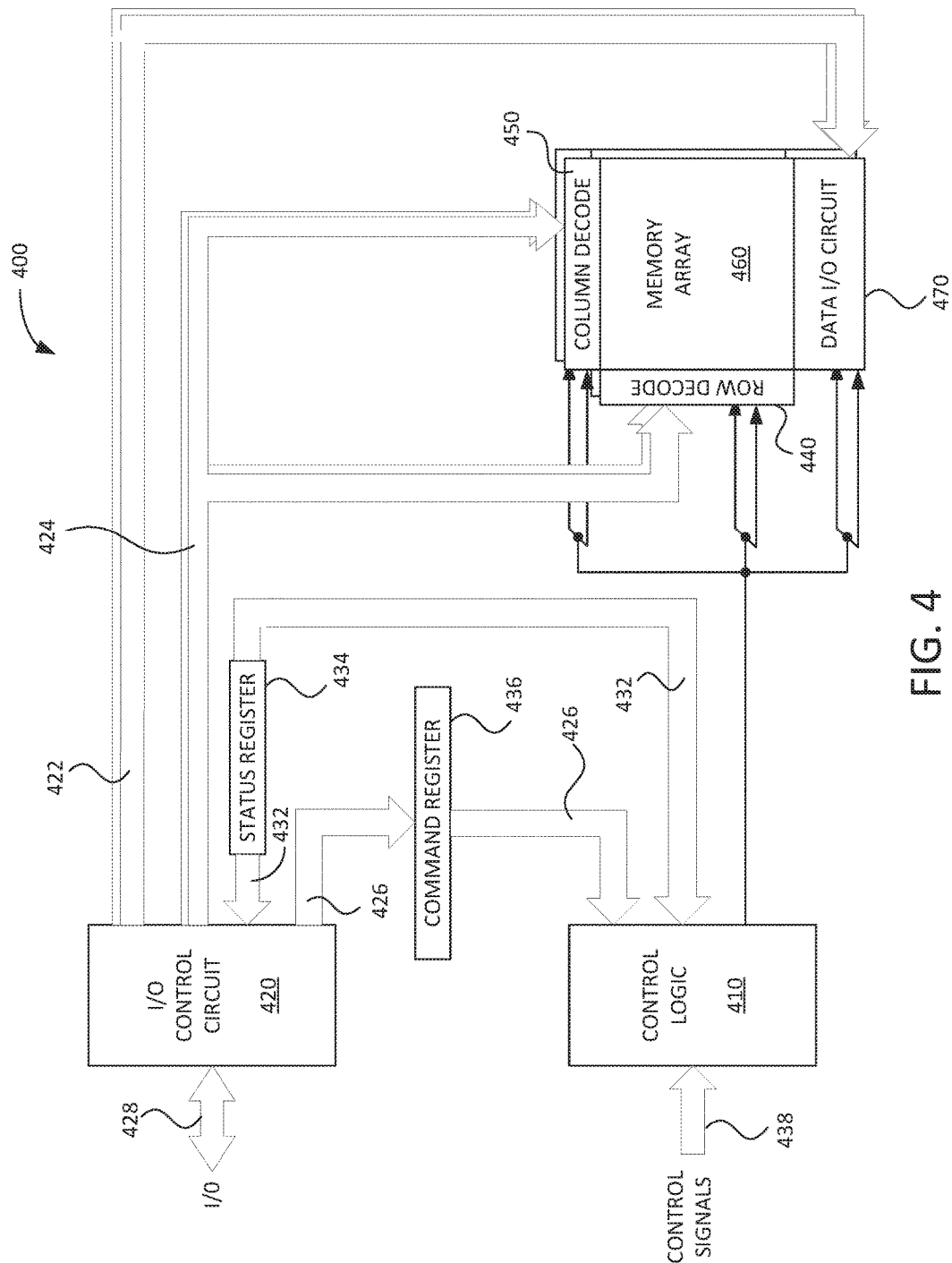
FIG. 4 is a block diagram of a memory, in accordance with an embodiment of the present invention.

FIG. 4 illustrates an apparatus that includes a memory device 400 according to an embodiment of the present invention. The memory device 400 includes a memory array 460 with a plurality of memory cells that are configured to store data. The memory cells may be accessed in the array through the use of various signal lines, word lines (WLs) and/or bit lines (BLs). The memory cells may be non-volatile memory cells, such as NAND or NOR flash cells, phase change memory cells, or may generally be any type of memory cells. The memory cells of the memory array 460 can be arranged in a memory array architecture. For example, in one embodiment, the memory cells are arranged in a 3D cross-point architecture. In other embodiments, other memory array architectures may be used, for example, a single-level cross-point architecture, among others. The memory cells may be single level cells configured to store data for one bit of data. The memory cells may also be multi-level cells configured to store data for more than one bit of data.

An I/O bus 428 is connected to an I/O control circuit 420 that routes data signals, address information signals, and other signals between the I/O bus 428 and an internal data bus 422, an internal address bus 424, and/or an internal command bus 426. An address register 425 may be provided address information by the I/O control circuit 420 to be temporarily stored. The I/O control circuit 420 is coupled to a status register 434 through a status register bus 432. Status bits stored by the status register 434 may be provided by the I/O control circuit 420 responsive to a read status command provided to the memory device 400. The status bits may have respective values to indicate a status condition of various aspects of the memory and its operation.

The memory device 400 also includes a control logic 410 that receives a number of control signals 438 either externally or through the command bus 426 to control the operation of the memory device 400. The control signals 438 may be implemented with any appropriate interface protocol. For example, the control signals 438 may be pin based, as is common in dynamic random access memory and flash memory (e.g., NAND flash), or op-code based. Example control signals 438 include clock signals, read/write signals, clock enable signals, etc. A command register 436 is coupled to the internal command bus 426 to store information received by the I/O control circuit 420 and provide the information to the control logic 410. The control logic 410 may further access a status register 434 through the status register bus 432, for example, to update the status bits as status conditions change. The control logic 410 may be configured to provide internal control signals to various circuits of the memory device 400. For example, responsive to receiving a memory access command (e.g., read, write), the control logic 410 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The address register 425 provides block-row address signals to a row decoder 440 and column address signals to a column decoder 450. The row decoder 440 and column decoder 450 may be used to select blocks of memory cells for memory operations, for example, read and write operations. The row decoder 440 and/or the column decoder 450 may include one or more signal line drivers configured to provide a biasing signal to one or more of the signal lines in the memory array 460.

A data I/O circuit 470 includes one or more circuits configured to facilitate data transfer between the I/O control circuit 420 and the memory array 460 based on signals received from the control logic 410. In various embodiments, the data I/O circuit 470 may include one or more registers, buffers, and other circuits for managing data transfer between the memory array 460 and the I/O control circuit 420. For example, during a write operation, the I/O control circuit 420 receives the data to be written through the I/O bus 428 and provides the data to the data I/O circuit 470 via the internal data bus 422. The data I/O circuit 470 writes the data to the memory array 460 based on control signals provided by the control logic 410 at a location specified by the row decoder 440 and the column decoder 450. During a read operation, the data I/O circuit 470 reads data from the memory array 460 based on control signals provided by the control logic 410 at an address specified by the row decoder 440 and the column decoder 450. The data I/O circuit provides the read data to the I/O control circuit 420 via the internal data bus 422. The I/O control circuit 420 then provides the read data on the I/O bus 428.

Those of ordinary skill in the art would appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
   a control circuit configured to receive a first set of data and store a copy of the first set of data in a page of a block of single level memory cells, and subsequently store the first set of data in a lower page of a block of multilevel memory cells,
   wherein the control circuit is configured to:

update one or more page tables responsive to storing at least the first set of data, receive a second set of data and store the second set of data directly in an upper page of the multilevel memory cells without storing a copy of the second set of data in the page of the block of single level memory cells, and erase the page of the block of single level memory cells responsive to storing the second set of data in the upper page of the block of multilevel memory cells.

2. The apparatus of claim 1, wherein the block of multilevel memory cells comprises memory cells configured to store at least three bits.

3. The apparatus of claim 1, wherein the control circuit is further configured to provide a confirmation message responsive to storing the first set of data in the page of the single level memory cells.

4. The apparatus of claim 1, wherein the control circuit is further configured to:

detect a power loss event while storing the second set of data in the upper page of the block of multilevel memory cells; and copy the first set of data from the page of the block of single level memory cells to the lower page of the block multilevel memory cells responsive to detecting the power loss event.

5. The apparatus of claim 4, wherein the control circuit is configured to continue storing the second set of data in the upper page of the multilevel memory cells responsive to the first set of data being copied from the page of the block of single level memory cells to the lower page of the block multilevel memory cells.

6. The apparatus of claim 5, wherein the control circuit is configured to erase the page of the block of single level memory cells responsive to completion of storing the second set of data in the upper page of the multilevel memory cells.

7. A method comprising:

storing a copy of a first set of data in a page of a block of single level memory cells;

subsequently to storing the copy of the first set of data in the page of the block of single level memory cells, receiving the first set of data at a lower page of a block of multilevel memory cells;

storing a second set of data in an upper page of the block of multilevel memory cells, wherein the page of the block of single level memory cells does not store a copy of the second set of data;

updating one or more page tables responsive to storing the first set of data or the second set of data; and erasing the page of the block of single level memory cells responsive to storing the second set of data in the upper page of the block of multilevel memory cells.

8. The method of claim 7, further comprising providing a confirmation message responsive to storing the first set of data in the page of the single level memory cells.

9. The method of claim 7, further comprising:

detecting a power loss event while storing the second set of data in the upper page of the block of multilevel memory cells; and copying the first set of data from the page of the block of single level memory cells to the lower page of the block multilevel memory cells responsive to detecting the power loss event.

10. The method of claim 9, further comprising continuing to store the second set of data in the upper page of the multilevel memory cells responsive to the first set of data being copied from the page of the block of single level memory cells to the lower page of the block multilevel memory cells.

11. An apparatus comprising:

a control circuit configured to receive a first set of data and store a copy of the first set of data in a page of a block of single level memory cells, and subsequently store the first set of data in a lower page of a block of multilevel memory cells, wherein the control circuit is configured to:

update one or more page tables responsive to storing at least the first set of data, receive a second set of data and store the second set of data directly in an upper page of the multilevel memory cells without storing a copy of the second set of data in the page of the block of single level memory cells, detect a power loss event while storing the second set of data in the upper page of the block of multilevel memory cells, and copy the first set of data from the page of the block of single level memory cells to the lower page of the block multilevel memory cells responsive to detecting the power loss event.

12. A method comprising:

storing a copy of a first set of data in a page of a block of single level memory cells;

subsequently to storing the copy of the first set of data in the page of the block of single level memory cells, receiving the first set of data at a lower page of a block of multilevel memory cells;

storing a second set of data in an upper page of the block of multilevel memory cells, wherein the page of the block of single level memory cells does not store a copy of the second set of data;

updating one or more page tables responsive to storing the first set of data or the second set of data;

detecting a power loss event while storing the second set of data in the upper page of the block of multilevel memory cells; and copying the first set of data from the page of the block of single level memory cells to the lower page of the block multilevel memory cells responsive to detecting the power loss event.

* * * * *